United States Patent
Yoon et al.

(10) Patent No.: US 10,048,423 B2
(45) Date of Patent: Aug. 14, 2018

(54) BACKLIGHT UNIT AND DISPLAY DEVICE INCLUDING THE SAME

(71) Applicant: Samsung Display Co., Ltd, Yongin-si, Gyeonggi-do (KR)

(72) Inventors: Sang Hyuck Yoon, Seoul (KR); So Jeong La, Suwon-si (KR); Han Moe Cha, Seoul (KR); Seok Hyun Nam, Seoul (KR)

(73) Assignee: Samsung Display Co., Ltd. (KR)

( * ) Notice: Subject to any disclaimer, the term of this patent is extended or adjusted under 35 U.S.C. 154(b) by 86 days.

(21) Appl. No.: 15/064,166

(22) Filed: Mar. 8, 2016

(65) Prior Publication Data
US 2016/0266299 A1    Sep. 15, 2016

(30) Foreign Application Priority Data

Mar. 11, 2015 (KR) .......................... 10-2015-0033989

(51) Int. Cl.
| | |
|---|---|
| *F21V 7/04* | (2006.01) |
| *F21V 8/00* | (2006.01) |
| *H01L 33/50* | (2010.01) |
| *G02F 1/13357* | (2006.01) |
| *G02F 1/1335* | (2006.01) |

(52) U.S. Cl.
CPC ......... *G02B 6/0026* (2013.01); *G02B 6/0031* (2013.01); *G02B 6/0066* (2013.01); *G02B 6/0073* (2013.01); *G02B 6/0088* (2013.01); *G02B 6/0091* (2013.01); *G02F 1/1336* (2013.01); *H01L 33/50* (2013.01);
(Continued)

(58) Field of Classification Search
CPC .. G02B 6/0026; G02B 6/0066; G02B 6/0073; G02B 6/0088; G02B 6/0031; G02B 6/0091; H01L 33/50; G02F 1/133617; G02F 1/133615; G02F 2001/133314; G02F 2202/36
USPC .................................. 362/608, 614; 349/71
See application file for complete search history.

(56) References Cited

U.S. PATENT DOCUMENTS

| | | |
|---|---|---|
| 7,193,248 B2 | 3/2007 | Weindorf et al. |
| 2008/0198300 A1 | 8/2008 | Okumura et al. |
| | | (Continued) |

FOREIGN PATENT DOCUMENTS

| | | |
|---|---|---|
| EP | 2650720 A1 | 10/2013 |
| EP | 2840438 A1 | 2/2015 |
| | (Continued) | |

OTHER PUBLICATIONS

EP 16157068.4.;extended European Search Report; (14 pages), dated Jan. 5, 2017.
(Continued)

*Primary Examiner* — Elmito Breval
*Assistant Examiner* — Omar Rojas Cadima
(74) *Attorney, Agent, or Firm* — Innovation Counsel LLP

(57) ABSTRACT

A backlight unit that may be used with a liquid crystal display is presented. The backlight unit includes: a bottom chassis; a light source disposed at an edge of the bottom chassis; a light-converting member disposed on the light source and including quantum dots for changing a wavelength of light emitted from the light source; and a light guide disposed on the bottom chassis adjacent to the light-converting member and positioned to receive light emitted from the light-converting member.

22 Claims, 8 Drawing Sheets

(52) U.S. Cl.
CPC .......... *G02F 1/133615* (2013.01); *G02F 2001/133614* (2013.01); *G02F 2202/36* (2013.01)

(56) References Cited

U.S. PATENT DOCUMENTS

| | | |
|---|---|---|
| 2011/0309325 A1 | 12/2011 | Park et al. |
| 2012/0075837 A1 | 3/2012 | Um |
| 2013/0148376 A1 | 6/2013 | Nick et al. |
| 2013/0277643 A1 | 10/2013 | Williamson et al. |
| 2014/0119049 A1 | 5/2014 | Kim et al. |
| 2015/0062967 A1 | 3/2015 | Bae et al. |
| 2015/0185410 A1* | 7/2015 | Song .......... G02B 6/0091 349/65 |
| 2015/0234111 A1* | 8/2015 | Lee .......... G02B 6/0023 362/608 |

FOREIGN PATENT DOCUMENTS

| | | |
|---|---|---|
| KR | 10-2012-0066322 A | 6/2012 |
| KR | 10-2012-0105953 A | 9/2012 |
| WO | 2013/015532 A2 | 1/2013 |
| WO | 2013/078251 A1 | 5/2013 |

OTHER PUBLICATIONS

EP 16157068.4 European Search Report dated Jul. 26, 2016, 9 pages.

\* cited by examiner

BACKLIGHT UNIT AND DISPLAY DEVICE INCLUDING THE SAME

CROSS-REFERENCE TO RELATED APPLICATION

This application claims priority to and the benefit of Korean Patent Application No. 10-2015-0033989 filed in the Korean Intellectual Property Office on Mar. 11, 2015, the entire content of which is incorporated herein by reference.

BACKGROUND (a) Technical Field

The present disclosure relates to a backlight unit and a liquid crystal display including the same.

(b) Description of the Related Art

A liquid crystal display (LCD) is one of the most widely used display devices today. Generally, the LCD displays an image by holding a liquid crystal material between an upper substrate formed with common electrodes, color filters, and the like, and a lower substrate formed with thin film transistors, pixel electrodes, and the like, and applying different voltages to the pixel and common electrodes to generate an electric field. Application of different voltages changes the arrangement of liquid crystal molecules, and thereby adjusting transmittance of light.

An LCD panel of the LCD is in itself a non-emissive type of light receiving element. Hence, an LCD generally includes a backlight unit for supplying light to the LCD panel.

As a light source for the backlight unit, a cold cathode fluorescent lamp (CCFL) has been widely used, since it consumes little power and provides bright white light. Recently, a light emitting diode (LED) has been gaining popularity since it has superior color reproducibility, a longer lifespan, and less power consumption.

Meanwhile, a technique for improving color reproducibility by applying quantum dots to a backlight unit has been developed. Quantum dots have low thermal stability and are easily oxidized, and thus are not directly applied to an LED package. An attempt has been made to provide the quantum dots in a form of being sealed in a tube such as a glass tube that is impervious to oxygen and moisture (hereinafter, referred to as a quantum dot rail). However, in order to provide the quantum dot rail, an additional space is required at a side at which a light source of a backlight unit is disposed (hereinafter referred to as a light input section), thereby increasing a bezel width.

The above information disclosed in this Background section is only for enhancement of understanding of the background of the invention and therefore it may contain information that does not form the prior art that is already known in this country to a person of ordinary skill in the art.

SUMMARY

The inventive device has been made in an effort to provide a backlight unit including a light-converting member and a display device including the same, which can reduce a bezel width of the display device.

An exemplary embodiment provides a backlight unit including: a bottom chassis; a light source disposed at an edge of the bottom chassis; a light-converting member disposed on the light source and including quantum dots for changing a wavelength of light emitted from the light source; and a light guide disposed on the bottom chassis adjacent to the light-converting member and positioned to receive light emitted from the light-converting member.

The light-converting member may include a sealing member and the quantum dots positioned therein.

The sealing member may include a glass tube, and the quantum dots are dispersed in a resin and filled in the glass tube.

The light-converting member may be formed to have a triangular prism shape including three surfaces extending in the same direction as the edge at which the light source is disposed.

Two of the three surfaces of the light-converting member may touch each other to form a right angle.

The substantially perpendicular surfaces may be respectively disposed to face the light source and an edge of the light guide.

The light-converting member may include a reflective layer disposed on a surface other than the two surfaces e surfaces that form a right angle.

The three surfaces may be flat surfaces.

One of the three surfaces may be a curved surface.

The backlight unit may further include a substrate disposed at an edge of the bottom chassis. The light source may be a light emitting diode (LED) package, and the light emitting diode (LED) package may be mounted in the substrate to allow a light output surface thereof to face one surface of the light-converting member.

The backlight unit may further include a reflection member disposed on the light source to be adjacent to the light-converting member to reflect light emitted from the light-converting member toward the light guide.

The reflection member may include a first portion including an inclination surface, a second portion extending from a first end of the first portion, and a third portion extending from a second end of the first portion. The third portion may have an opening that overlaps the light source.

An exemplary embodiment of the inventive concept provides a display device including: a display panel; and a backlight unit configured to supply light to the display panel, wherein the backlight unit includes: a bottom chassis; a light source disposed at an edge of the bottom chassis; a light-converting member disposed on the light source and including quantum dots for changing a wavelength of light emitted from the light source; and a light guide disposed on the bottom chassis adjacent to the light-converting member and positioned to receive light emitted from the light-converting member.

The light-converting member may include a sealing member and the quantum dots positioned therein.

The sealing member may include a glass tube, and the quantum dots are dispersed in a resin and filled in the glass tube.

The light-converting member may be formed to have a triangular prism shape including three surfaces extending in the same direction as the edge at which the light source is disposed.

Two of the three surfaces of the light-converting member may touch each other to form a right angle.

The substantially perpendicular surfaces may be respectively disposed to face the light source and an edge of the light guide.

The light-converting member may include a reflective layer disposed on a surface other than the two surfaces that form a right angle.

The three surfaces may be flat surfaces.

One of the three surfaces may be a curved surface.

The display device unit may further include a substrate disposed at an edge of the bottom chassis, the light source may be a light emitting diode (LED) package, and the light emitting diode (LED) package may be mounted in the substrate to allow a light output surface thereof to face one surface of the light-converting member.

The display device unit may further include a reflection member disposed on the light source to be adjacent to the light-converting member to reflect light emitted from the light-converting member toward the light guide.

The reflection member may include a first portion including an inclination surface, a second portion extending from a first end of the first portion, and a third portion extending from a second end of the first portion. The third portion may have an opening that overlaps the light source in the third portion.

The light-converting member according to the exemplary embodiment can be vertically disposed with respect to the light source in the backlight unit since the light-converting member can change a path of light emitted from the light source while changing a wavelength of the light. Accordingly, a space occupied by the light-converting member and the light source, particularly a width thereof, can be reduced as compared with the case that the light-converting member and the light source are disposed in parallel, thereby reducing a bezel width of the display device.

DETAILED DESCRIPTION OF THE EMBODIMENTS

Figure 1:
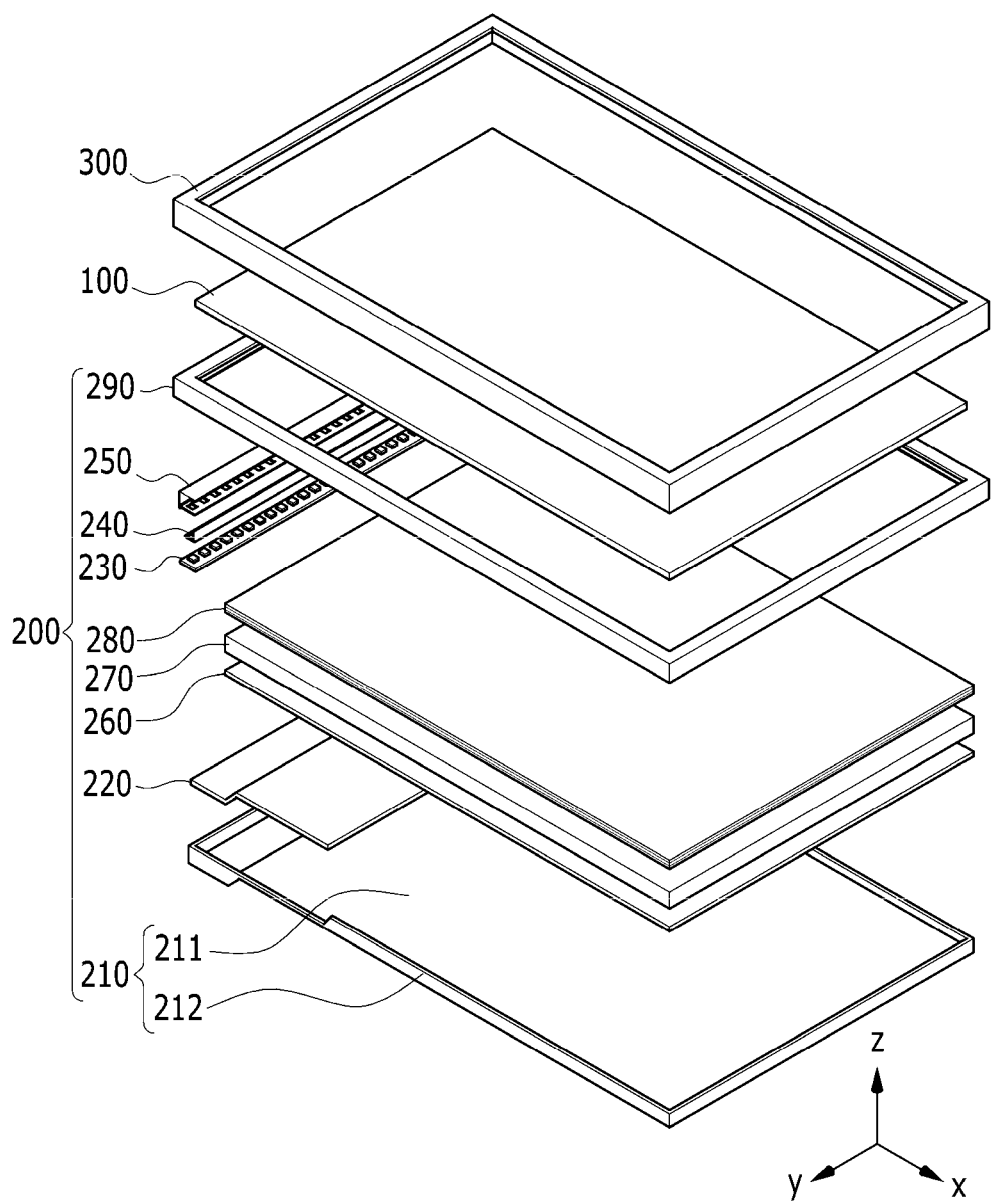
FIG. 1 is an exploded perspective view of a liquid crystal display including a backlight unit according to an exemplary embodiment of the inventive concept.

The inventive concept will be described more fully hereinafter with reference to the accompanying drawings, in which exemplary embodiments are shown. As those skilled in the art would realize, the described embodiments may be modified in various different ways, all without departing from the spirit or scope of the inventive concept.

In the drawings, the thickness of layers, films, panels, regions, etc., are exaggerated for clarity. It will be understood that when an element, such as, a layer, film, region, or substrate is referred to as being "on" another element, it may be directly on the other element or intervening elements may also be present. In contrast, when an element is referred to as being "directly on" another element, there are no intervening elements present. In this specification, unless otherwise noted, "overlap" means superposition when viewed in a plan view.

A liquid crystal display including a backlight unit according to an exemplary embodiment will now be described in detail with reference to FIG. 1 to FIG. 5.

Figure 2:
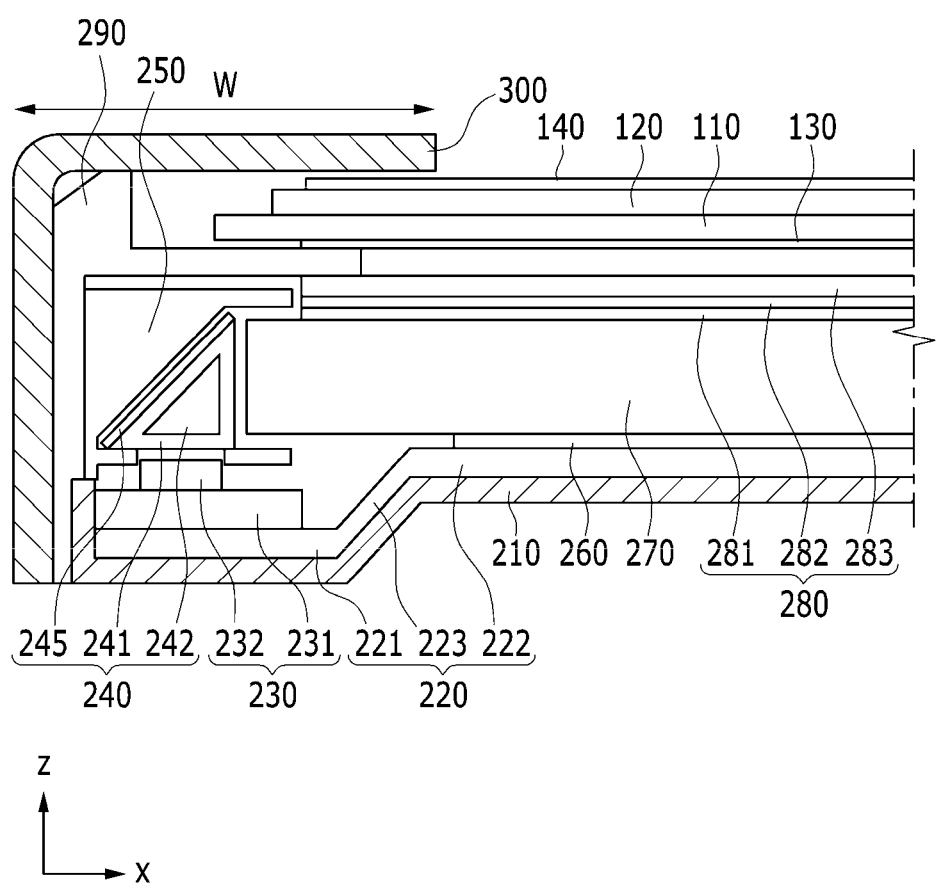
FIG. 2 is a cross-sectional view of the backlight unit illustrated in FIG. 1 taken from a side where a light input section is positioned.
Figure 3:
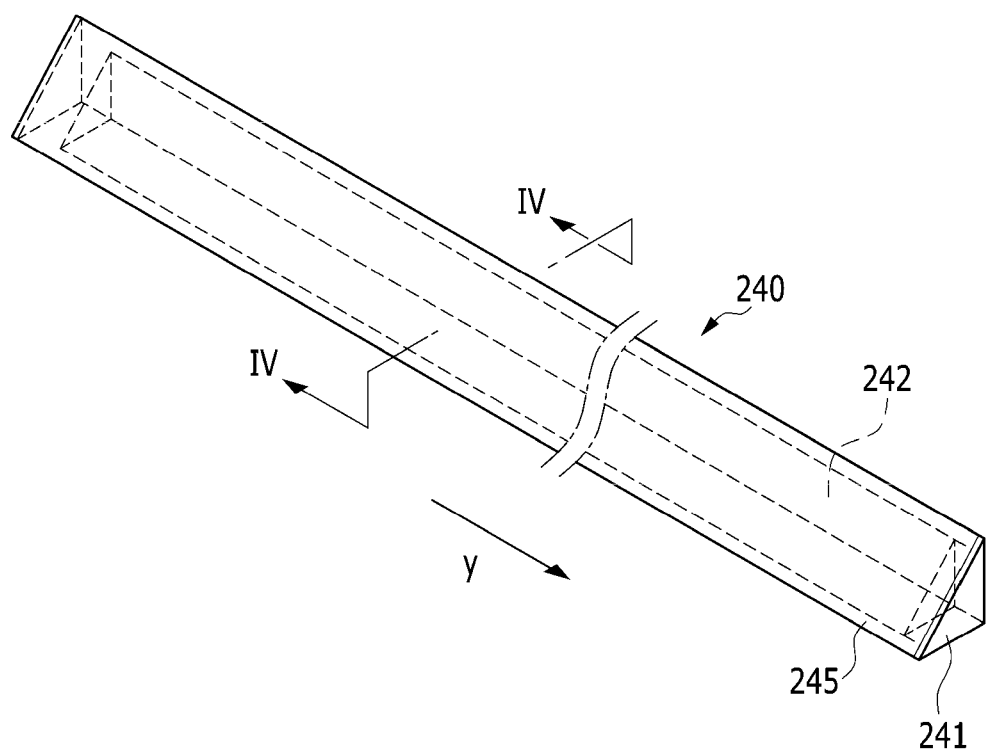
FIG. 3 is a perspective view of a light-converting member in the backlight unit illustrated in FIG. 1.
Figure 4:
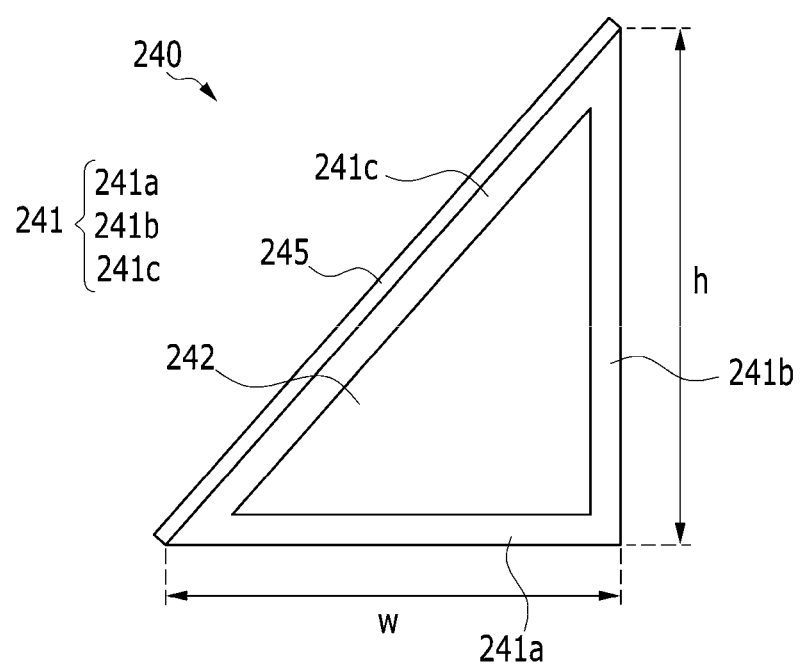
FIG. 4 is a cross-sectional view of the light-converting member taken along a line IV-IV of FIG. 3.
Figure 5:
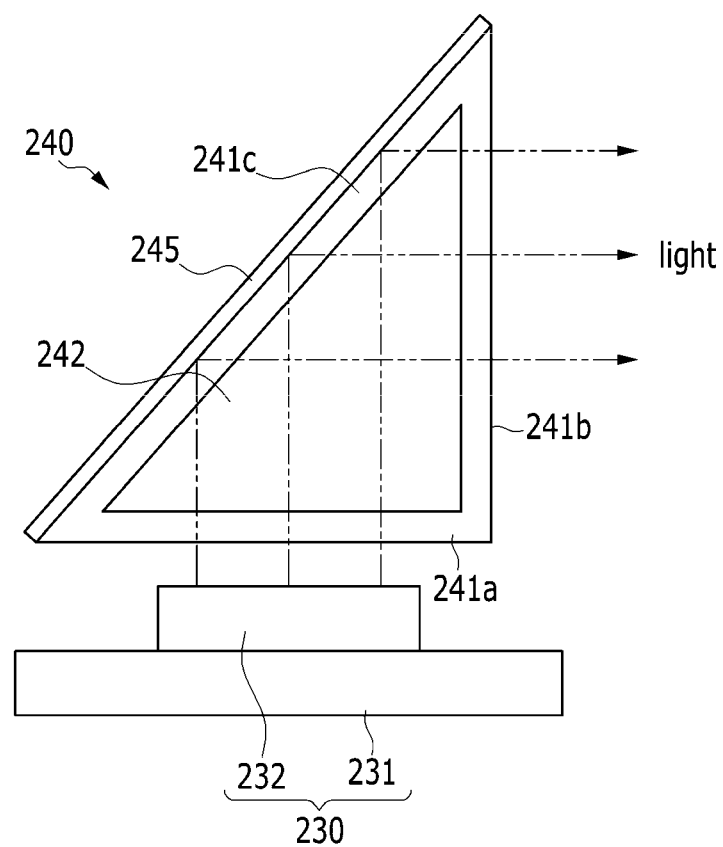
FIG. 5 illustrates a path of light emitted from a light source in the backlight unit illustrated in FIG. 1.
Figure 6:
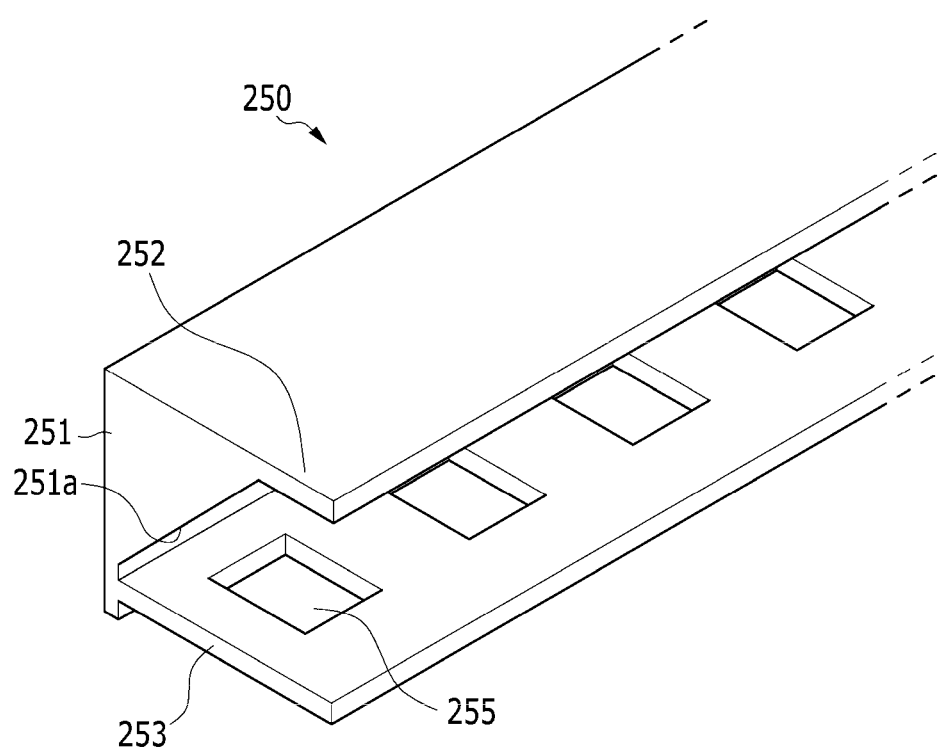
FIG. 6 is a perspective view of a reflection member in the backlight unit illustrated in FIG. 1.

FIG. 1 is an exploded perspective view of a liquid crystal display including a backlight unit according to an exemplary embodiment, and FIG. 2 is a cross-sectional view of the backlight unit illustrated in FIG. 1 taken from a side where a light input section is positioned. FIG. 3 is a perspective view of a light-converting member in the backlight unit illustrated in FIG. 1, and FIG. 4 is a cross-sectional view of the light-converting member taken along a line IV-IV of FIG. 3. FIG. 5 illustrates a path of light emitted from a light source in the backlight unit illustrated in FIG. 1. FIG. 6 is a perspective view of a reflection member in the backlight unit illustrated in FIG. 1.

Referring to FIG. 1 and FIG. 2, the liquid crystal display basically includes a liquid crystal display panel 100 and a backlight unit 200. The backlight unit 200 supplies light to the liquid crystal display panel, and the liquid crystal display panel 100 displays an image by controlling the supplied light. The liquid crystal display further includes a top chassis 300 that protects the liquid crystal display panel 100 by enclosing a rim thereof and prevents the liquid crystal display panel 100 from being separated from the backlight unit 200. The top chassis 300 may be omitted.

The liquid crystal display panel 100 includes a lower display substrate 110, an upper display substrate 120, and a liquid crystal layer (not shown). The lower display substrate 110 and the upper display substrate 120 are attached to each other while maintaining a predetermined interval therebetween, and the liquid crystal layer is formed therebetween.

The lower display substrate 110 includes a transparent insulation substrate such as glass, and a plurality of thin film transistors, data lines, gate lines, pixel electrodes, etc. that are formed on the insulation substrate. A data line is connected to a source terminal of a thin film transistor, and a gate line is connected to a gate terminal thereof. A pixel electrode formed of a transparent conductive material such as indium tin oxide (ITO) is connected to a drain terminal of the thin film transistor.

The upper display substrate 120 positioned to face the lower display substrate 110 includes a transparent insulation substrate, and color filters, common electrodes, etc. that are formed on the insulation substrate. Each of the color filters may be included to represent primary colors such as red, green, and blue. A common electrode is formed of a transparent conductive material such as indium tin oxide (ITO) and indium zinc oxide (IZO). At least one of the color filter and the common electrode may be positioned in the lower display substrate 110.

Polarizers 130 and 140 are attached to a bottom surface of the lower display substrate 110 and to a top surface of the upper display substrate 120, respectively. The polarizers 130 and 140 may polarize incident light on the LCD panel 100 to allow light vibrating only in one direction to be transmitted.

In the liquid crystal display panel 100, when the thin film transistor is turned on by a signal applied to the gate line, a signal applied to the data line is applied to the pixel electrode. Then, an electric field of predetermined intensity is generated between the pixel electrode and the common electrode to control alignments of liquid crystal molecules of the liquid crystal layer. Accordingly, transmittance of light passing through the liquid crystal layer is controlled to display an image.

The liquid crystal display includes at least one driving device (not shown) such as a driver, and a controller that controls signals applied to the liquid crystal display panel 100. As an IC chip, the driving device may be mounted on the liquid crystal display panel 100 or on a printed circuit board (PCB) and a flexible printed circuit board (FPCB) to be electrically connected to the liquid crystal display panel 100. Some driving devices may be integrated into the liquid crystal display panel 100.

The backlight unit 200 is positioned below the liquid crystal display panel 100 to supply light to the liquid crystal display panel 100.

The backlight unit 200 includes a bottom chassis 210 and various components accommodated therein or fixed thereto. The bottom chassis 210 and each of the components will now be described.

The bottom chassis 210 is open upward, so it is a kind of container having an accommodating space of a predetermined depth. The bottom chassis 210 may have, for example, an overall quadrangular tray-like shape. The bottom chassis 210 includes a substantially flat bottom portion 211, and a wall 212 that upwardly extends from edges of the bottom portion 211. The bottom portion 211 may be substantially flat, and may be bent like steps at one side to accommodate a light source 230, which will be described later in more detail, i.e., a light input section. The bottom portion 211 may include a portion that is partially protruded or recessed to fix constituent elements disposed thereon or to support them at a predetermined height.

The bottom chassis 210 may be formed of a metallic material such as an aluminum plate, an aluminum alloy plate, or zinc-plated steel. According to another exemplary embodiment, the bottom chassis 210 may be formed of a plastic material such as a polycarbonate (PC).

In the bottom chassis 210, a bracket 220, a light source 230, a reflective sheet 260, a light guide 270, an optical sheet 280, etc. are accommodated. The supporter 220 and the light source 230 may be accommodated at an edge of the bottom chassis 210 where the light input section is positioned.

The supporter 220 serves as a kind of radiating component for transferring heat generated in the light source 230 to the bottom chassis 210. The supporter 220 may be disposed on the bottom portion 211 of the bottom chassis 210 at the edge thereof where the light input section is positioned, and at least one part of the supporter 220 may be positioned close to the bottom chassis 210 to accomplish sufficient contact area with the bottom chassis 210.

The supporter 220 may be made of a metal material having good thermal conductivity to quickly transfer heat generated from the light source 230 to the bottom chassis 210, thereby preventing the light source 230 from overheating. For example, the supporter 220 may be made of aluminum, an aluminum alloy, or the like by using extrusion molding. However, a material of the supporter 220 may not be limited to the metal. For example, the supporter 220 may be made of a material such as a thermally conductive plastic. The supporter 220 may not be provided. In this case, the light source 230 may be disposed immediately on the bottom chassis 210.

The supporter 220 may be formed to have an overall quadrangular plate shape, and may be bent like steps. For example, the supporter 220 includes a first portion 221 on which the light source 230 is disposed, a second portion 222 on which the light guide 270 is disposed, and a third portion 223 positioned to connect the first portion 221 and the second portion 222. In the backlight unit 200, the first portion 231 may be positioned to be lower than the second portion 222. The reason that the first portion 221 and the second portion 222 are positioned at different heights is to adjust heights of the light guide 270 and a light-converting member 240 to be substantially the same.

The light source 230 includes a substrate 231 and a light source 232 mounted therein. The light source 230 is illustrated to be disposed around an edge of the bottom chassis 210, but may be disposed around a plurality of edges, for example around opposite edges.

The substrate 231 serves to support the light source 232 and supply power to the light source 232. The substrate 231 may be a circuit board, and particularly, a metal core printed circuit board (MCPCB). The substrate 231 may be formed to have an overall elongated bar shape with a narrow width. The substrate 231 may be secured such that a wide surface thereof is closely positioned on the supporter 220. As described above, the supporter 220 includes the first portion 221, the second portion 222, and the third portion 223. In this case, the substrate 231 may be disposed on the first portion 221.

Since the substrate 231 of the light source 230 is attached to the supporter 220 and the supporter 220 is attached to the bottom chassis 210, the heat generated from the light source 232 may be efficiently transferred and radiated to the bottom chassis 210 through the substrate 231 and the supporter 220. That is, the substrate 231, the supporter 220, and the bottom chassis 210 may serve as a heat sink of the light source 232. For effective heat transfer and radiation, the substrate 231 and the supporter 220 may be formed of a material having a superior heat transfer characteristic, and for example, as described above, the substrate 231 may be the MCPCB and the supporter 220 may be made of a metallic material having good thermal conductivity.

The light source 232 is electrically connected to wires of the substrate 231 to receive power, and emits light by converting electrical energy into light energy. The light source 232 may emit blue light or UV light. The light source 232 is disposed such that a light output section is positioned to substantially face an upper side.

The light source 232 may be an LED package including a light emitting diode (LED) chip, and a plurality of LEDs may be disposed at a predetermined interval on one substrate 231 in a line as described above, or in a plurality of rows. The LED package is mounted in the substrate 231 such that a light output surface thereof is positioned to face the light-converting member 240 to be described later. As a result, the light output surface of the LED package may be substantially parallel to a horizontal plane of the substrate 231. The LED package may include a blue LED and/or a UV LED. In addition to the LED package, a point light source (e.g., an organic light emitting diode (OLED) package) or a linear light source (e.g., a CCFL) may be used as the light source 232.

The light-converting member 240 is disposed on the light source 232 to change a wavelength of light emitted from the light source 232. To that end, the light-converting member 240 includes quantum dots. The quantum dots indicate nanoparticles of a semiconductor material each of which has a diameter that is in a range of several nanometers to tens of nanometers, and having a quantum confinement effect. The quantum dots serve to change the wavelength of light emitted from the light source 232 to generate fluorescence, which is stronger than a typical fluorescent substance, with a narrow wavelength band.

Light emission of quantum dots is performed by the transition of excited electrons from a conduction band to a valance band. Even in the case of the same material, the wavelength is varied according to particle size. That is, as the size of the quantum dots is reduced, light of a shorter wavelength is emitted. Accordingly, it is possible to obtain light of a desired wavelength band by adjusting the size of the quantum dots. Examples of quantum dots may include Si-based nanocrystalline, II-VI group-based compound semiconductor nanocrystalline, III-V group-based compound semiconductor nanocrystalline, and IV-VI group-based compound semiconductor nanocrystalline quantum dots, and detailed compounds are well known to those in the related technical field. The quantum dots may have a heterostructure of core/shell in which surfaces thereof are surrounded with a different material.

The quantum dots may include quantum dots of sizes for absorbing light of a blue wavelength band emitted from the aforementioned light source 232, and then emitting light of a green wavelength and light of a red wavelength band. Accordingly, some of blue light introduced into the light-converting member 240 is converted to green light and red light, and the light-converting member 240 emits white light in which the green light, the red light, and the blue light are mixed. As a result, the blue light emitted from the light source 232 is converted to white light while passing through the light-converting member 240. The white light emitted through the light-converting member 240 has high purity of three primary colors, particularly high purity of green and red, thereby accomplishing outstanding color reproducibility. Meanwhile, in the case of a light source 232 emitting UV light, the quantum dots may be of sizes for absorbing light of a UV wavelength band and emitting blue light, green light, and red light.

The light-converting member 240 is disposed above the light source 232 along a direction in which the light source 232 is disposed. Light that is upwardly emitted from the light source 232 and introduced into the light-converting member 240 may be subjected to conversion while passing through the light-converting member 240, and may be laterally emitted toward the light guide 270. Since the light-converting member 240 and the light source 232 are vertically disposed, the width of the light input section can be reduced as compared with the case that the light source 232 and the light-converting member 240 are horizontally disposed in parallel, and thus the bezel width W of the display device can be reduced. This disposal structure of the light-converting member 240 will be described in detail with reference to FIG. 3 to FIG. 5.

The light-converting member 240 may have an overall triangular prism shape and a length which substantially corresponds to that of the light source 230. The light-converting member 240 includes a sealing member 241 and quantum dots 242 positioned therein.

The sealing member 241 may correspond to the overall shape of the light-converting member 240, i.e., a triangular prism tube with blocked opposite ends. The sealing member 241 may be made of a transparent material that is impervious to oxygen and moisture, like a glass tube. The quantum dots 242 may be easily oxidized, and thus the sealing member 241 serves to seal the quantum dots 242 positioned therein such that they are not oxidized. The light-converting member 240 is formed by filling the quantum dots 242 in the sealing member 241 that is formed as an elongated tube such as a glass tube, and is referred to as a quantum dot rail. According to another exemplary embodiment, the sealing member 241 may be made of a polymer resin, for example.

The quantum dots 242 are dispersed in a diversion medium such as a polymer resin or an organic solvent, and are filled in the sealing member 241. A transparent material which does not generate light reflection and light absorption while having no influence on wave conversion performance of the quantum dots 242 may be employed. Examples of this material may include a polymer resin such as epoxy, silicone, polystyrene, and acrylate, and an organic solvent such as toluene, chloroform, and ethanol, but the present invention is not limited thereto. When the polymer resin is employed as the dispersion medium, a polymer resin in which the quantum dots 242 are dispersed may be injected into the sealing member 241 that is in a vacuum state, and then may be cured.

Further diffusion beads may be dispersed along with the quantum dots 242 in the sealing member 241.

The diffusion beads may be made of a material such as silicon, and may serve to increase a probability of light meeting the quantum dots 242 by diffusing light in the sealing member 241, thereby increasing light converting efficiency of the light-converting member 240.

The light-converting member 240 may be formed to have a prism shape with a right-triangular cross section, and include three surfaces 241a, 241b, and 241c in a longitudinal direction. Among them, the first surface 241a and the second surface 241b may be substantially perpendicular to each other, and may respectively correspond to a width w and a height h of the light-converting member 240. The third surface 241c may correspond to an inclination surface. The three surfaces 241a, 241b, and 241c may be flatly formed, and a pattern may be formed on at least one of the surfaces 241a, 241b, and 241c. In the drawing, an edge at which the two surfaces meet each other is illustrated to be sharply formed, but it may have a rounded shape. This right triangular prism shape of the light-converting member 240 may be defined by the sealing member 241 of the light-converting member 240. The sealing member 241 may be a substantially right triangle tube having a substantially uniform thickness (e.g., several hundreds of micrometers) and blocked opposite ends.

In the backlight unit 200, the first surface 241a may be positioned toward the light source 232 substantially in parallel with the light output surface of the light source 232. The second surface 241b may be positioned toward the light guide 270 substantially in parallel with an edge of the light guide 270. A width w of the first surface 241a and a height h of the second surface 241b may be in a range of several millimeters. The width of the first surface 241a is wider than that of the light output surface of the light source 232, and thus is advantageous in receiving light emitted from the light source 232. The height h of the second surface 241b is slightly thicker than a thickness of the light guide 270, and thus is advantageous in terms of efficiency of introducing light into the light guide 270.

As shown in FIG. 2, the first surface 241a is slightly separated from the light source 232, and the second surface 241b is slightly separated from the light guide 270. However, the first surface 241a and the second surface 241b may be respectively disposed to contact the light source 232 and the light guide 270.

The light-converting member 240 may include a reflective layer 245 at which the third surface 241c serving as the inclination surface is formed. For example, it may be a silver (Ag) reflective layer having reflectance, and the reflective layer 245 may be directly deposed on the third surface 241c or may be attached to the reflective layer 245 in a sheet form. As such, in the case where the reflective layer 245 is formed on the inclination surface, referring to FIG. 5, the light introduced from the light source 232 into the light-converting member 240 in which the quantum dots 242 are dispersed through the first surface 241a travels in the light-converting member 240 while the wavelength thereof is changed by the quantum dots 242 or is not changed, and is then reflected by the reflective layer 245 formed in the third surface 241*c* and is outputted to the second surface 241*b*. Accordingly, although the light-converting member 240 is disposed above the light source 232, light can be emitted toward the light guide 270 which is disposed parallel with the light-converting member 240. Further, when light is reflected by the reflective layer 245, a moving distance of the light in the light-converting member 240 is increased, and thus a probability of meeting the quantum dots 242 in the light-converting member 240 is increased, thereby increasing light converting efficiency.

Meanwhile, in the drawing, a path of light is illustrated to be formed in one direction. This is for illustrating incidence/emission from/to the light-converting member 240 and light reflection caused by the reflective layer 245. Actually, the path of light can be formed in any direction in the light-converting member 240. This is because the light absorbed by the quantum dots 242 is emitted in all directions after being subjected to the conversion. According to another exemplary embodiment, the light-converting member 240 may not include a reflective layer 245. In this case, a reflection member 250 to be described later may replace the reflective layer 245.

The reflection member 250 may be disposed to be adjacent to the light-converting member 240 and to have a length which substantially corresponds to that of the light-converting member 240. The reflection member 250 serves to reflect light emitted from the light-converting member 240 to return to the light-converting member 240 or toward the light guide 270.

The reflection member 250 may be disposed to surround the light-converting member 240. For example, the reflection member 250 includes a triangular prism-shaped first portion 251 at which an inclination surface 251*a* is positioned to face the third surface 241*c* of the light-converting member 240. The light emitted through the third surface 241*c* of the light-converting member 240 is reflected toward the light-converting member 240 by the inclination surface 251*a* of the first portion 251.

The reflection member 250 may have a second portion 252 which is positioned to extend from a substantially upper end of the first portion 251 in a horizontal direction, and a third portion 253 which is positioned to extend from a substantially lower end of the first portion 251 in the horizontal direction. The second portion 252 of the reflection member 250 may be positioned to overlap the light guide 270. An upper surface of the third portion 253 may be positioned to face the first surface 241*a* of the light-converting member 240, and an end portion of the third portion 253 may be positioned to overlap the light guide 270. In this case, the light emitted from the light source 232 toward the first surface 241*a* of the light-converting member 240 can be covered by the third portion 253, and thus an opening 255 is formed at a portion that corresponds to the light source 232 in the third portion 253. Accordingly, when light sources 232 are disposed at a predetermined interval, openings 255 are formed at the corresponding interval.

The light which is upwardly emitted from the light-converting member 240 is reflected by a lower surface of the second portion 252 toward the light guide 270. Further, the light which is downwardly emitted from the light-converting member 240 is reflected by an upper surface of the third portion 253 toward an inside of the light-converting member 240 or the light guide 270. Accordingly, light leakage is minimized, thereby increasing light use efficiency.

The reflection member 250 may be formed by using a white-color resin having reflectivity. For example, the reflection member 250 may be formed of a plastic material such as polyethylene terephthalate (PET), polycarbonate (PC), or polystyrene (PS). The reflection member 250 may include a light reflective material such as titanium dioxide ($TiO_2$) to increase light reflectance. According to another exemplary embodiment, additional reflective layers may be formed on the inclination surface 251*a* of the reflection member 250 and/or the lower surface of the second portion 252 and the upper surface of the third portion 253.

This structure of the reflection member 250 is merely an example, and the reflection member 250 may be variously modified. The reflection member 250 may be disposed to attachably support the light-converting member 240, and may include an additional means (not illustrated) for restricting the movement of the light-converting member 240. According to another exemplary embodiment, the reflection member 250 may be omitted. In this case, a structure for fixing the light-converting member 240 may be provided, or the light-converting member 240 may be directly fixed to the bottom chassis 210, the light source 230, the mold frame 290, or the like.

The light guide 270 is employed to guide the light emitted from the light-converting member 240 and transfer it to the liquid crystal display panel 100. To that end, the light guide 270 is disposed on the bottom portion 211 of the bottom chassis 210 to allow an edge thereof to be overlapped with that of the light-converting member 240, and is disposed substantially in parallel with the light-converting member 240. In order for the light guide 270 to be disposed at substantially the same level (height) of the light-converting member 240, the light guide 270 may be disposed on the second portion 222 of the supporter 220 which is bent as described above.

The light guide 270 may be formed of a polymethylmethacrylate (PMMA) material having high light transmittance, a polymethacrylstyrene (MS) material having excellent heat resistance and humidity resistance, or the like. The light guide 270 serves to convert the light generated from the light source unit 230, which has an optical distribution of a point or line light source, into light having an optical distribution of a surface light source, that is, to uniformly distribute the generated light. A flat or wedge plate may be used as the light guide 270, and one or both surfaces thereof may be formed with a pattern.

A reflective sheet 260 is positioned below the light guide 270, that is, between the light guide 270 and the bottom chassis 210. The reflective sheet 260 reflects the light traveling toward the light guide 270 such that the reflected light is finally directed toward the LCD panel 100, thereby improving optical efficiency. The reflective sheet 260 may be formed of a plastic material such as polyethylene terephthalate (PET), polycarbonate (PC), and polystyrene (PS). The reflective sheet 260 may include a light reflective material such as titanium dioxide ($TiO_2$) to increase light reflectance.

The optical sheet 280 is positioned on the light guide 270. The optical sheet 280 may include a diffuser sheet 281, a prism sheet 282, a protecting sheet 283, etc. The diffuser sheet 281 is used to allow the light emitted from the light guide 270 to have uniform distribution, that is, to generate a surface light source of uniform brightness. The prism sheet 282 controls a traveling direction of the light diffused by the diffuser sheet 281 such that the traveling direction of the light is perpendicular to the LCD panel 100. The protecting sheet 283 may be used to protect a prism of the prism sheet 282 from scratches and the like. The protecting sheet 283 may also serve to widen a viewing angle that is previously narrowed by the prism sheet 282.

The optical sheet 280 may exclude one of the prism sheet 282 and the protecting sheet 283 while including a plurality of the others. The optical sheet 280 may further include an optical sheet having characteristics other than those described above. For example, the optical sheet 280 may include a reflective polarizer sheet that can improve luminance efficiency by separating, transmitting, and reflecting polarization components of light.

The backlight unit 200 includes a mold frame 290 that has a predetermined height to stably fix the LCD panel 100 to the backlight unit 200. For example, the mold frame 290 may be combined with the bottom chassis 210 such that it is hooked and fastened to a hook (not shown) and the like that enclose the wall 212 of the bottom chassis 210. In this case, a part of the mold frame 290 may press the optical sheet 280 to limit movement of the optical sheet 280 as well as the light guide 270 and the reflective sheet 260 therebelow. The mold frame 290 may also support the reflection member 250 to not be moved. The mold frame 290 may be formed in one piece or a plurality of pieces.

The liquid crystal display panel 100 is fixed onto the mold frame 290. The liquid crystal display panel 100 may be attached to a flat surface of the mold frame 290 through an adhesion member (not shown), and the adhesion member may be a double-sided cushion tape having impact-absorbing capability to reduce impacts applied to the liquid crystal display panel 100.

Though not illustrated, an inverter board and/or a PCB for signal conversion may be mounted on a bottom surface of the bottom chassis 210 as a PCB for power supply. The inverter board converts an external power supply into a constant voltage level to supply it to the light source 232. The PCB for signal conversion may convert an analog data signal into a digital data signal to transmit it to the liquid crystal display panel 100 through the flexible printed circuit board attached to the liquid crystal display panel 100.

A process of supplying light of a backlight unit 200 having the aforementioned structure to a liquid crystal display panel 100 will now be briefly described. First, when power is supplied to the light source 232 through the substrate 231 of the light source 203 disposed on the supporter 220, the light source 232 generates light, e.g., blue light, to be upwardly emitted. The emitted light is introduced into the light-converting member 240 through the first surface 241a of the sealing member 241 of the light-converting member 240, and some of the emitted light is converted into green light or red light. The converted light (green light and red light) and the non-converted light (blue light) are guided toward the light guide 270 by the reflective layer 245 of the light-converting member 240 or the reflection member 250. As a result, the light-converting member 240 changes a light path while changing a wavelength of the light.

The light (white light) emitted from the light-converting member 240 is uniformly distributed toward the optical sheet 280 while passing through the light guide 270, and the light emitted from the bottom portion 211 of the bottom chassis 210 is reflected by the reflective sheet 260 toward the optical sheet 280. Thereafter, the light is diffused while passing through the optical sheet 280, thereby adjusting an advancing direction, and thus the light is supplied to the entire surface of the liquid crystal display panel 100.

Hereinafter, a light-converting member according to other exemplary embodiments will be described with reference to FIG. 7 and FIG. 8.

Figure 7:
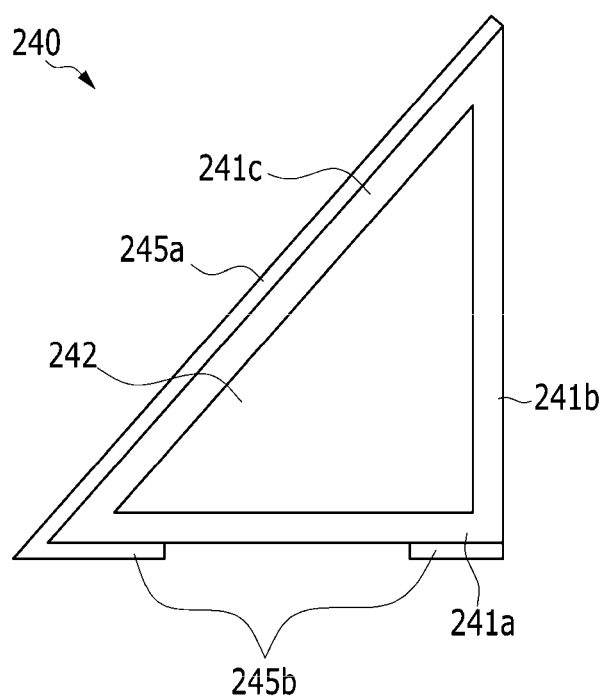
FIG. 7 is a perspective view of a light-converting member according to an exemplary embodiment.
Figure 8:
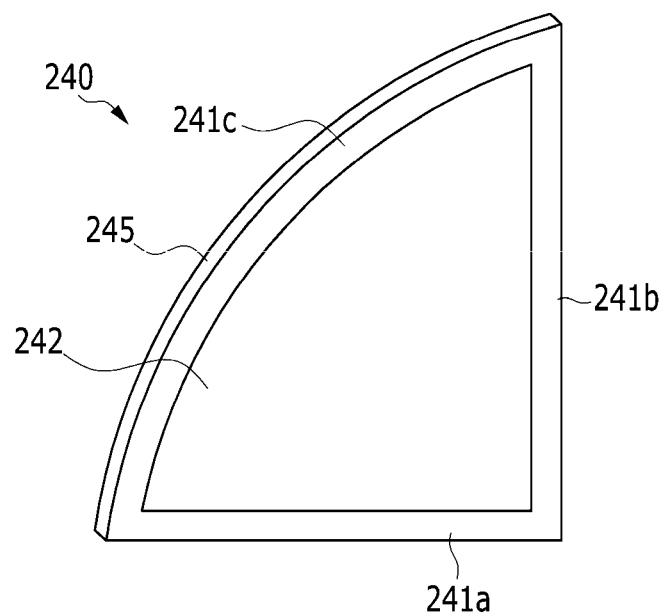
FIG. 8 is a perspective view of a light-converting member according to an exemplary embodiment.

FIG. 7 is a perspective view of a light-converting member according to an exemplary embodiment, and FIG. 8 is a perspective view of a light-converting member according to an exemplary embodiment.

Referring to FIG. 7, an example in which the third surface 241c serving as the inclination surface of the light-converting member 240 is curved is illustrated. Similar to the aforementioned exemplary embodiment, the light-converting member 240 may be formed to have a substantially right-triangular prism shape including three surfaces 241a, 241b, and 241c in a longitudinal direction. However, unlike in the aforementioned exemplary embodiment in which the reflective layer is formed on the third surface 241c serving as the inclination surface, a reflective layer 245a is formed on the third surface 241c, and a reflective layer 245b is formed at a portion of the first surface 241a in the present exemplary embodiment.

The light converted in the light-converting member 240 can advance in all directions, and thus can advance toward the first surface 241a on which the light guide 270 is disposed. Some of the light emitted through the first surface 241a is reflected by the reflective layer 245b toward the light-converting member 240, thereby increasing light use efficiency. A portion of the first surface 241a at which no reflective layer 245b is formed is positioned to overlap the light source 232 disposed therebelow. In the case where the light source 232 is an LED package, such a portion may correspond to a light output surface of the LED package such that the LED light is introduced into the light-converting member 240.

Referring to FIG. 8, an example in which the third surface 241c of the light-converting member 240 is curved is illustrated. That is, the light-converting member 240 has an overall triangular prism shape, but the third surface 241c serving as the inclination surface may be convexly curved. When the curvature of the curved surface is appropriately designed, an amount of light passing toward the light guide 270 can be increased. The case where the inclination surface is convexly curved has been described as an example, but any structure that is appropriate for transferring light emitted from the light-converting member 240 toward the light guide 270 is suitable. Meanwhile, when the third surface 241c of the light-converting member 240 is curved, the inclination surface 251a of the reflection member 250 may be correspondingly curved.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:
1. A backlight unit comprising:
   a bottom chassis;
   a light source disposed at an edge of the bottom chassis;
   a light-converting member disposed on the light source and including quantum dots for changing a wavelength of light emitted from the light source;
   a light guide disposed on the bottom chassis adjacent to the light-converting member and positioned to receive light emitted from the light-converting member, and wherein the light-converting member is formed to have a triangular prism shape including three surfaces extending in the same direction as the edge at which the light source is disposed.

2. The backlight unit of claim 1, wherein the light-converting member includes a sealing member and the quantum dots positioned therein.

3. The backlight unit of claim 2, wherein the sealing member includes a glass tube, and the quantum dots are dispersed in a resin and filled in the glass tube.

4. The backlight unit of claim 1, wherein two of the three surfaces of the light-converting member touch each other to form a right angle.

5. The backlight unit of claim 4, wherein the two of the three surfaces are respectively disposed to face the light source and an edge of the light guide.

6. The backlight unit of claim 5, wherein the light-converting member includes a reflective layer disposed on a surface other than the two surfaces that form a right angle.

7. The backlight unit of claim 1, wherein the three surfaces are flat surfaces.

8. The backlight unit of claim 1, wherein one of the three surfaces is a curved surface.

9. The backlight unit of claim 1, further comprising
a substrate disposed at an edge of the bottom chassis,
wherein the light source is a light emitting diode (LED) package, and the light emitting diode (LED) package is mounted in the substrate to allow a light output surface thereof to face one surface of the light-converting member.

10. The backlight unit of claim 1, further comprising
a reflection member disposed on the light source to be adjacent to the light-converting member to reflect light emitted from the light-converting member toward the light guide.

11. The backlight unit of claim 10, wherein the reflection member includes a first portion including an inclination surface, a second portion extending from a first end of the first portion, and a third portion extending from a second end of the first portion, and
the third portion has an opening that overlaps the light source.

12. A display device comprising:
a display panel; and
a backlight unit configured to supply light to the display panel,
wherein the backlight unit includes:
a bottom chassis;
a light source disposed at an edge of the bottom chassis;
a light-converting member disposed on the light source and including quantum dots for changing a wavelength of light emitted from the light source; and
a light guide disposed on the bottom chassis adjacent to the light-converting member and positioned to receive light emitted from the light-converting member,
wherein the light-converting member is disposed vertically above the light source so as to be configured to change a path of light upwardly emitted from the light source such that the light upwardly emitted from the light source and introduced into the light-converting member is laterally emitted toward the light guide,
wherein the light-converting member is formed to have a triangular prism shape including three surfaces extending in the same direction as the edge at which the light source is disposed.

13. The display device of claim 12, wherein the light-converting member includes a sealing member and the quantum dots positioned therein.

14. The display device of claim 13, wherein the sealing member includes a glass tube, and the quantum dots are dispersed in a resin and filled in the glass tube.

15. The display device of claim 12, wherein two of the three surfaces of the light-converting member touch each other to form a right angle.

16. The display device of claim 15, wherein the two of the three surfaces are respectively disposed to face the light source and an edge of the light guide.

17. The display device of claim 16, wherein the light-converting member includes a reflective layer disposed on a surface other than the two surfaces that form a right angle.

18. The display device of claim 12, wherein the three surfaces are flat surfaces.

19. The display device of claim 12, wherein one of the three surfaces is a curved surface.

20. The display device unit of claim 12, further comprising
a substrate disposed at an edge of the bottom chassis,
wherein the light source is a light emitting diode (LED) package, and the light emitting diode (LED) package is mounted in the substrate to allow a light output surface thereof to face one surface of the light-converting member.

21. The display device of claim 12, further comprising
a reflection member disposed on the light source to be adjacent to the light-converting member to reflect light emitted from the light-converting member toward the light guide.

22. The display device of claim 21, wherein the reflection member includes a first portion including an inclination surface, a second portion extending from a first end of the first portion, and a third portion extending from a second end of the first portion, and
the third portion has an opening that overlaps the light source.

* * * * *